United States Patent
Franson et al.

(10) Patent No.: US 12,080,661 B2
(45) Date of Patent: *Sep. 3, 2024

(54) INTEGRATED STRUCTURES WITH ANTENNA ELEMENTS AND IC CHIPS EMPLOYING EDGE CONTACT CONNECTIONS

(71) Applicant: VIASAT, INC., Carlsbad, CA (US)

(72) Inventors: Steven J. Franson, Scottsdale, AZ (US); Douglas J. Mathews, Mesa, AZ (US)

(73) Assignee: VIASAT, INC., Carlsbad, CA (US)

( * ) Notice: Subject to any disclaimer, the term of this patent is extended or adjusted under 35 U.S.C. 154(b) by 378 days.

This patent is subject to a terminal disclaimer.

(21) Appl. No.: 17/372,797

(22) Filed: Jul. 12, 2021

(65) Prior Publication Data

US 2022/0005770 A1 Jan. 6, 2022

Related U.S. Application Data

(63) Continuation of application No. 16/538,197, filed on Aug. 12, 2019, now Pat. No. 11,088,098.

(51) Int. Cl.
*H01L 23/66* (2006.01)
*H01L 21/50* (2006.01)
(Continued)

(52) U.S. Cl.
CPC .............. *H01L 23/66* (2013.01); *H01L 21/50* (2013.01); *H01L 23/49816* (2013.01); *H01L 23/49822* (2013.01); *H01L 23/5383* (2013.01); *H01Q 1/2283* (2013.01); *H01Q 1/38* (2013.01); *H01L 21/60* (2021.08); *H01L 2021/60285* (2013.01); *H01L 2223/6616* (2013.01); *H01L 2223/6627* (2013.01); *H01L 2223/6677* (2013.01)

(58) Field of Classification Search
CPC ......... H01L 23/49816; H01L 23/49822; H01L 23/5383; H01L 21/50; H01L 23/66; H01Q 1/2283; H01Q 1/38
USPC ........................................................ 257/728
See application file for complete search history.

(56) References Cited

U.S. PATENT DOCUMENTS 7,030,466 B1 4/2006 Hsuan
9,153,863 B2 10/2015 Nair et al.
(Continued)

OTHER PUBLICATIONS

International Search Report dated Oct. 15, 2020 in corresponding PCT Application No. PCT/US2020/045806 (12 pages).
(Continued)

*Primary Examiner* — Quoc D Hoang
(74) *Attorney, Agent, or Firm* — F. CHAU & ASSOCIATES, LLC

(57) ABSTRACT

Disclosed is an antenna apparatus including a substrate having a cavity in a first outer surface thereof. The substrate has a sidewall defining a portion of the cavity, and a first edge contact is formed at the sidewall. An IC chip is disposed within the cavity and has a side surface facing the sidewall and a second edge contact formed on the side surface electrically connected to the first edge contact. An antenna element, disposed at a second outer surface of the substrate opposite the first outer surface, is electrically connected to RF circuitry within the IC chip through a conductive via extending within the substrate.

20 Claims, 16 Drawing Sheets

(51) Int. Cl.
    *H01L 23/498*     (2006.01)
    *H01L 23/538*     (2006.01)
    *H01Q 1/22*     (2006.01)
    *H01Q 1/38*     (2006.01)
    *H01L 21/60*     (2006.01)

(56) References Cited

U.S. PATENT DOCUMENTS

| | | |
|---|---|---|
| 11,088,098 B2 * | 8/2021 | Franson ............ H01Q 21/0093 |
| 2008/0224320 A1 | 9/2008 | Palmade et al. |
| 2010/0190464 A1 | 7/2010 | Chen et al. |
| 2013/0189935 A1 | 7/2013 | Nair et al. |
| 2014/0225795 A1 | 8/2014 | Yu |
| 2015/0346322 A1 | 12/2015 | Schmalenberg et al. |
| 2016/0218072 A1 | 7/2016 | Liao et al. |
| 2016/0219712 A1 * | 7/2016 | Ko .......................... H01L 24/14 |
| 2018/0268178 A1 | 9/2018 | Sugimoto et al. |
| 2018/0332151 A1 | 11/2018 | Kamgaing et al. |
| 2019/0058241 A1 | 2/2019 | So et al. |
| 2019/0088603 A1 | 3/2019 | Marimuthu et al. |
| 2019/0139915 A1 | 5/2019 | Dalmia et al. |
| 2019/0333881 A1 | 10/2019 | Chen et al. |
| 2020/0135671 A1 | 4/2020 | Chen et al. |
| 2020/0176376 A1 | 6/2020 | Ndip et al. |
| 2021/0050312 A1 | 2/2021 | Franson et al. |

OTHER PUBLICATIONS

Kulick, "Indiana Integrated Circuits, LLC and Quilt Packaging(R) Technology: An Overview", Indiana Integrated Circuits, LLC, 42 pages.

* cited by examiner

US 12,080,661 B2

INTEGRATED STRUCTURES WITH ANTENNA ELEMENTS AND IC CHIPS EMPLOYING EDGE CONTACT CONNECTIONS

CROSS REFERENCE TO RELATED APPLICATION

This application is a continuation under 35 U.S.C. 120 of U.S. patent application Ser. No. 16/538,197, filed Aug. 12, 2019 in the U.S. Patent and Trademark Office, the content of which is incorporated by reference herein in its entirety.

TECHNICAL FIELD

This disclosure relates generally to connection techniques and arrangements between IC chips and other circuit components supported by a substrate, such as printed antenna elements.

DISCUSSION OF RELATED ART

In wireless communications it is typically desired to provide small sized antenna equipment in which antenna elements are integrated with IC chips containing beamforming components. Satellite applications, for example, typically employ phased arrays with many microstrip patch antenna elements disposed on a substrate. The antenna elements may be electrically coupled to distributed power amplifiers supplying RF power and to phase shifters controlled by a processor to dynamically steer the resulting antenna beam. The power amplifiers, phase shifters, and other front end equipment such as receiving circuitry, may be provided within IC chips integrated with the antenna elements in a unitary structure.

SUMMARY

In an aspect of the presently disclosed technology, an antenna apparatus includes a substrate having a cavity in a first outer surface thereof. The substrate has a sidewall defining a portion of the cavity, and a first edge contact is formed at the sidewall. An IC chip is disposed within the cavity and has a side surface facing the sidewall and a second edge contact formed on the side surface electrically connected to the first edge contact. An antenna element, disposed at a second outer surface of the substrate opposite the first outer surface, is electrically connected to RF circuitry within the IC chip through a conductive via extending within the substrate.

The electrical connection of the antenna element to the RF circuitry within the IC chip may be made through the first and second edge contacts. Alternatively, the connection of the antenna element may be made from an electrical contact at a bottom surface of the IC chip.

In another aspect, a method of fabricating an antenna apparatus involves forming a cavity in a first outer surface of a substrate, and forming an antenna element on a second outer surface of the substrate opposite the first outer surface. A first edge contact is formed at a sidewall of the cavity. An IC chip is placed into the cavity, where the IC chip has a second edge contact formed on a side surface thereof, and includes RF circuitry. The first and second edge contacts are electrically connected. A conductive via is formed extending from the second outer surface within the substrate, and the antenna element is electrically connected to the RF circuitry through the conductive via.

In another aspect, a method of fabricating an electronically steerable antenna array, includes: forming within a substrate a plurality of cavities spatially arranged along a first outer surface of the substrate; forming a plurality of antenna elements spatially arranged on a second outer surface of the substrate opposite the first outer surface; providing a plurality of IC chips, each having a side surface with a respective first edge contact, each IC chip including beamforming components; for each of the cavities: forming a second edge contact on a sidewall of the cavity; placing a respective one of the plurality of IC chips into the cavity; electrically connecting the respective first and second edge contacts; and electrically connecting the beamforming components of the IC chip placed therein to a respective at least one of the antenna elements.

BRIEF DESCRIPTION OF THE DRAWINGS

The above and other aspects and features of the disclosed technology will become more apparent from the following detailed description, taken in conjunction with the accompanying drawings in which like reference characters indicate like elements or features. Various elements of the same or similar type may be distinguished by annexing the reference label with a dash and second label that distinguishes among the same/similar elements (e.g., -1, -2). However, if a given description uses only the first reference label, it is applicable to any one of the same/similar elements having the same first reference label irrespective of the second reference label. Elements and features may not be drawn to scale in the drawings.

DETAILED DESCRIPTION OF EMBODIMENTS

The following description, with reference to the accompanying drawings, is provided to assist in a comprehensive understanding of certain exemplary embodiments of the technology disclosed herein for illustrative purposes. The description includes various specific details to assist a person of ordinary skill the art with understanding the technology, but these details are to be regarded as merely illustrative. For the purposes of simplicity and clarity, descriptions of well-known functions and constructions may be omitted when their inclusion may obscure appreciation of the technology by a person of ordinary skill in the art.

Figure 1:
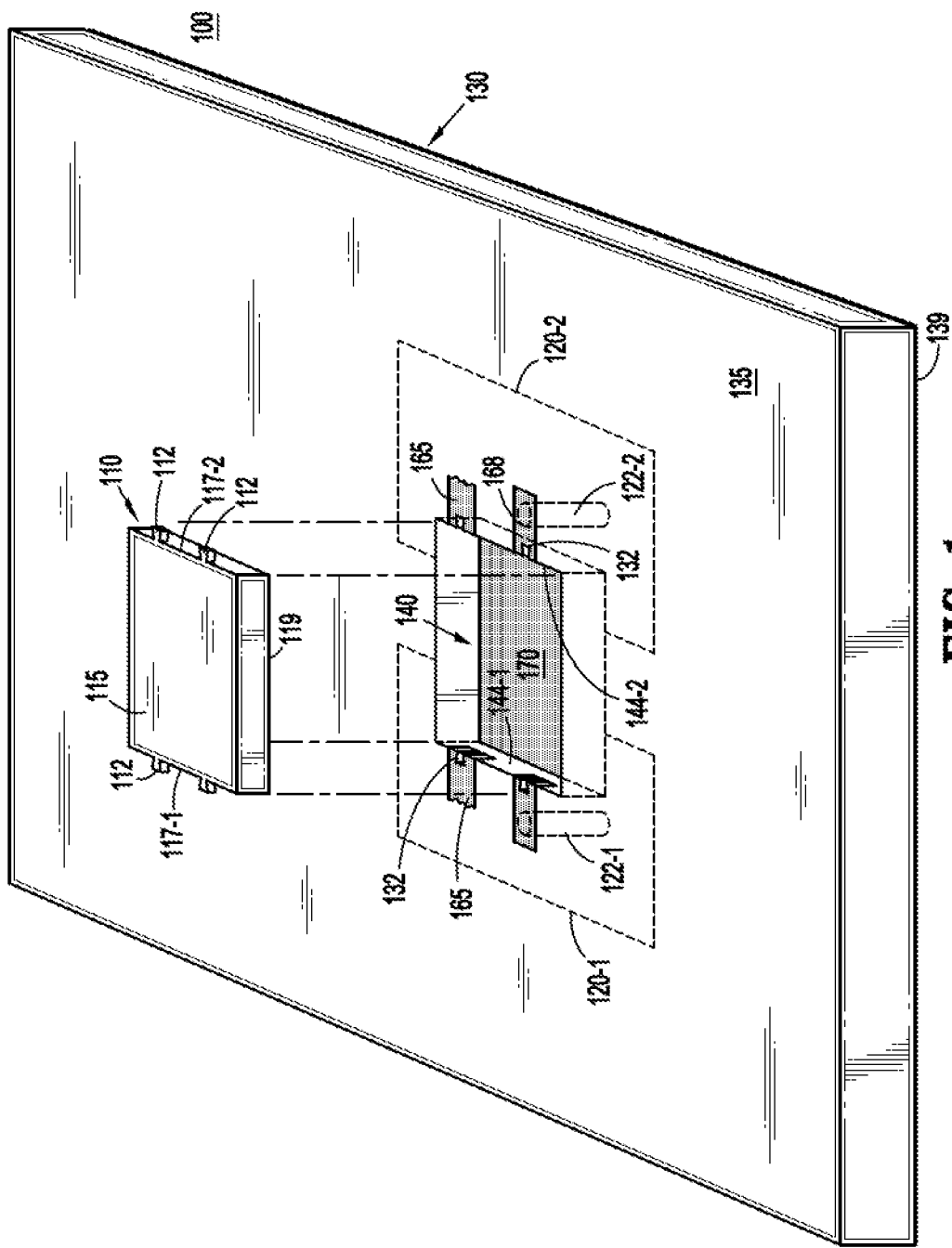
FIG. 1 is a perspective exploded view of an example antenna apparatus according to an embodiment.

FIG. 1 is a perspective exploded view of an example antenna apparatus, 100, according to an embodiment. Antenna apparatus 100 includes a substrate 130 and at least one antenna element 120 (e.g. two antenna elements 120-1, 120-2) electrically connected to RF circuitry within an IC chip 110. Each antenna element 120 is exemplified as a microstrip patch element printed on a lower surface 139 ("second outer surface") of substrate 130. While depicted with a rectangular shape, antenna element 120 may have any other suitable shape to form a desired radiation pattern. Further, other types of antenna elements such as dipoles or slot antenna elements may be substituted to realize target performance metrics.

Substrate 130 has a cavity 140 formed within its top surface 135 ("first outer surface") and having a depth that extends to a bottom surface, which may coincide with a top surface of a ground plane 170. In an assembled state of antenna apparatus 100, IC chip 110 is disposed within cavity 140 and a top surface 115 of IC chip 110 is substantially coplanar with a top surface 135 of substrate 130. In the assembled state, a bottom surface 119 of IC chip 110 faces and may abut ground plane 170. At least one first edge contact 132 is disposed at a sidewall 144 of cavity 140. At least one second edge contact 112 is located on a side surface 117 of IC chip 110, and is electrically connected to an adjacent first edge contact 132. One antenna element 120 may be fed with RF signals (in transmit and/or receive directions) by a probe feed embodied as a through-substrate-via (TSV) (hereafter, "conductive via" or just "via") 122. Via 122 may electrically connect to a short conductive trace 168 which in turn electrically connects to a first edge contact 132, thus completing an electrical connection between antenna element 120 and RF circuitry within IC chip 110 connected to a second edge contact 112.

Herein, the term IC chip refers to one or more electronic circuits embodied within a small flat piece of semiconductor material. For example, IC chip 110 may be a monolithic microwave IC (MMIC) composed of gallium arsenide (GaAs), indium phosphide (InP), silicon germanium (SiGe) or gallium nitride (GaN). IC chip 110 may include a power amplifier for amplifying a transmit path signal output to antenna element 120 and/or may include a low noise amplifier (LNA) for amplifying a receive path signal received by antenna element 120.

In the illustrated example, two antenna elements 120-1, 120-2 are connected to a single IC chip 110 through a combination of vias 122-1, 122-2; first edge contacts 132 on opposite sidewalls 144-1, 144-2 of cavity 140; and second edge contacts 112 on opposite side surfaces 117-1, 117-2 of IC chip 110, respectively. Also, IC chip 110 includes another pair of second edge contacts 112 each connected to one conductive trace 165 through an adjacent first edge contact 132. Each conductive trace 165 may electrically connect to a component (not shown) such as a terminal that receives a bias voltage or a control signal applied to an RF component within IC chip 110 such as an amplifier or a dynamically controlled phase shifter. In other examples, IC chip 110 includes more or fewer edge contacts 112 to make more or fewer connections to components as desired for a particular application; and more or fewer antenna elements 120 are connected to IC chip 110. For RF connections, microstrip or coplanar waveguide (CPW) transitions may be made. For instance, conductive traces 165 and 168 in the drawings herein are shown as single lines; in the case of microstrip, conductive traces 165 may be microstrip lines over a ground plane (e.g., 170). In the case of CPW, conductive traces 165 may each be an inner conductive trace in between a pair of outer conductive ground traces (albeit not shown in the figures).

Antenna apparatus 100 is comprised of at least one IC chip 110 and at least one antenna element 120 as shown in FIG. 1. In a typical application, antenna apparatus 110 is comprised of several, tens or hundreds IC chips 110, each within a respective cavity 140 spatially arranged along substrate 130. In this typical application, at least some, or all, of the IC chips 110 are respectively connected to one or more antenna elements 120 spatially arranged along substrate 130's lower surface 139, thereby forming an antenna array. The antenna array may be an electronically steered antenna such as a phased array dynamically steered by phase shifters collectively located within the IC chips 110 or elsewhere within antenna apparatus 100. Substrate 130 may include beamforming circuitry electrically coupled to the IC chips 110 to divide an input RF signal during a transmit operation and/or combine a plurality of RF signals received from the antenna elements 120 and processed (e.g. amplified, filtered, phase shifted, down-converted, etc.) by IC chips 110 during a receive operation.

Figure 2:
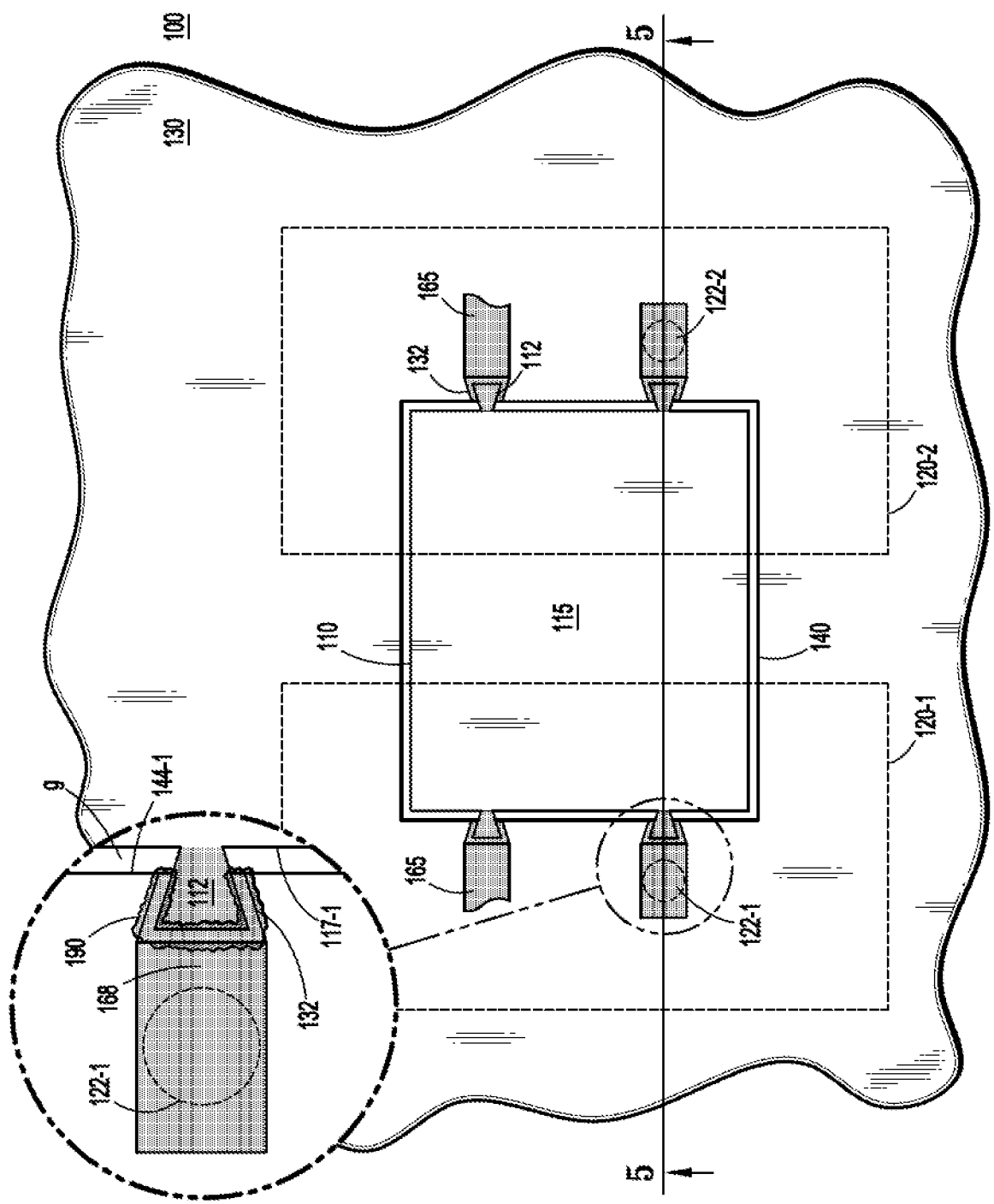
FIG. 2 is a plan view of the antenna apparatus of FIG. 1 in an assembled state.
Figure 3:
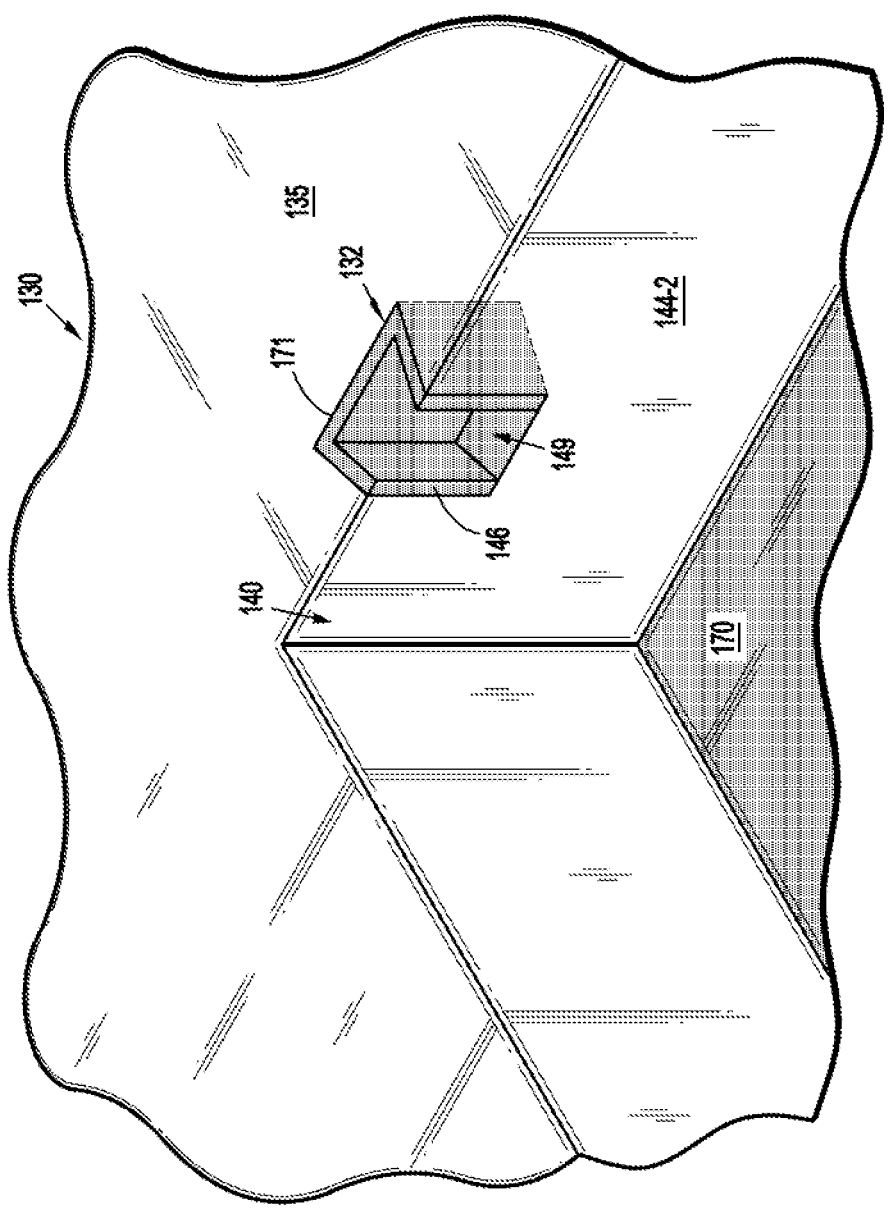
FIG. 3 is a perspective view illustrating an example first edge contact on a cavity sidewall.
Figure 4:
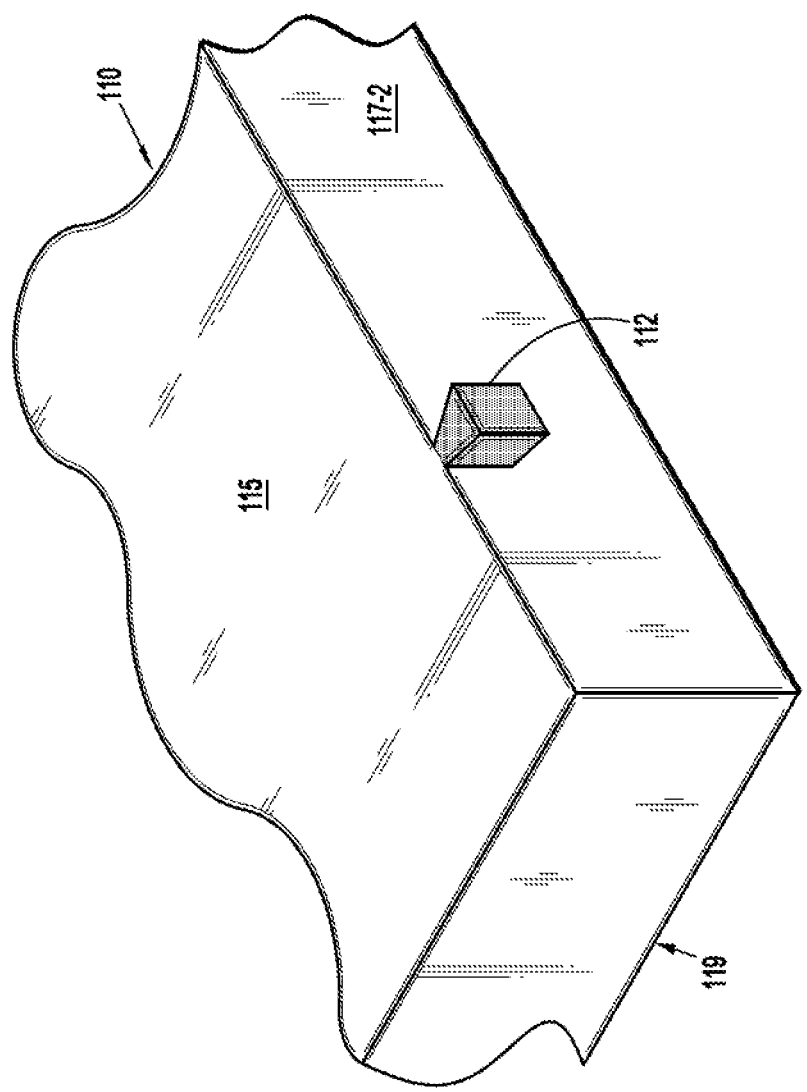
FIG. 4 is a perspective view illustrating an example second edge contact formed on a side surface of an IC chip.
Figure 5:
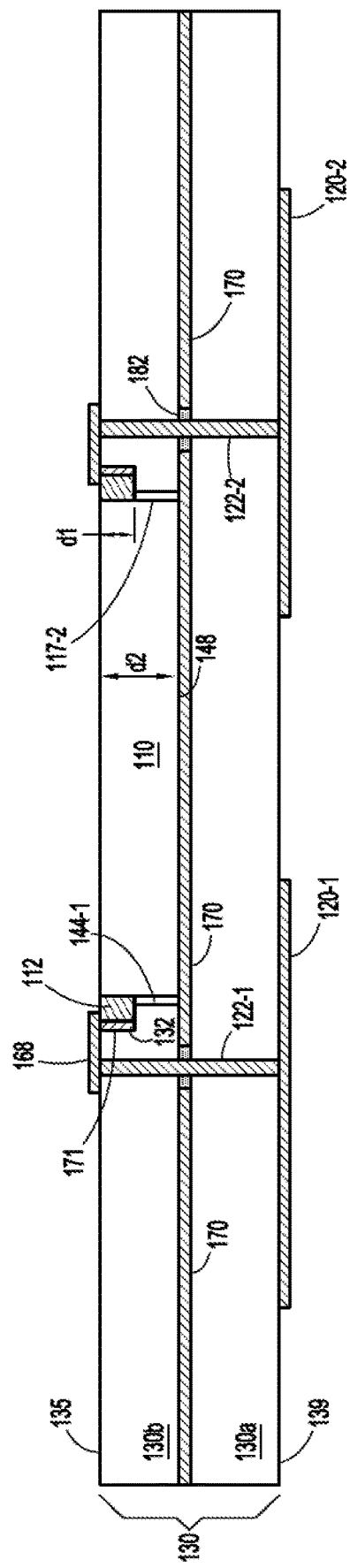
FIG. 5 is a cross-sectional view taken along the lines 5-5 of the antenna apparatus of FIG. 2.

FIG. 2 is a plan view of antenna apparatus 100 of FIG. 1 in an assembled state. FIG. 3 is a perspective view illustrating an example first edge contact 132 on a cavity sidewall. FIG. 4 is a perspective view illustrating an example second edge contact 112 formed on a side surface of IC chip 110. FIG. 5 is a cross-sectional view taken along the lines 5-5 of FIG. 2. Referring collectively to FIGS. 1-5, a first edge contact 132 and an adjacent second edge contact 112 may have complementary geometric shapes. Each first edge contact 132 may have metallic peripheral surfaces in a three dimensional (3D) structure, e.g., a 3D structure plated to form side, base and rear metallic peripheral surfaces. The dimensions of the complementary geometric structures may form a close fit to enable IC chip 110 to be placed within cavity 140 so that the second edge contacts 112 "snap in" to the first edge contacts 132. This may help secure IC chip 110 in place within cavity 140 prior to any electrical connection enhancement between the edge contacts 112, 132 through soldering, thermocompression, thermasonic bonding, or the like. Alternatively, a complete electrical connection can be made by just a press fit between the edge contact structures, without any soldering, etc. The close fit between adjacent first and second edge contacts 132, 112 may cause the respective edge contacts to be interlocked. For instance, as seen in FIG. 3, a first edge contact 132 may have a slotted, flared opening 149, which is a recess within cavity sidewall 144-2. An adjacent second edge contact 112 as best seen in FIG. 4 may be in the form of a flared protrusion from side surface 117-2 that closely fits within slotted opening 149. With the outer surfaces of second edge contacts 112 in close contact with the inner surfaces of corresponding first edge contacts 132, solder or other conductive bonding material 190 (see FIG. 2) may be applied therebetween to complete or enhance an electrical connection. The conductive bonding material may also serve at least partially as a mechanical connection of IC chip 110 to substrate 130. The outer dimensions of IC chip 110 may also form a close fit or even a press fit with respect to the sidewalls 144 of cavity 140. A small gap "g" may exist between a side surface 117 of IC chip 110 and a sidewall 144 to allow for thermal expansion or manufacturing tolerances.

If a coplanar waveguide (CPW) transition is used for the edge contacts 112, 132 as mentioned earlier, a ground-signal-ground (GSG) snap connection may be made between corresponding edge contacts 112, 132. In this configuration there are three connection points per electrical connection. In other words, a second edge contact 112 may be comprised of three contacts: one "signal" contact between and electrically isolated from two "ground" contacts. A corresponding first edge contact 132 also includes three connection points comprised of one signal contact between two ground contacts.

In an alternative embodiment, corresponding first and second edge contacts 112, 132 are each embodied with a dielectric waveguide structure such as an optical conduit akin to optical fiber. In this case, conductive trace 165 is substituted with an optical conduit (hereafter, optical conduit 165 in this context) to permit an externally provided RF modulated laser to propagate to electronics within IC chip 110 through the optical conduit connection of first and second edge contacts 112, 132. An optical-RF converter within IC chip 110 converts the optical signal to an RF signal, which is output to antenna elements 120 through a different edge contact pair 112, 132. Thus, in this embodiment, a signal is input to IC chip 110 as "RF over fiber" and is then converted to RF within IC chip 110 and radiated through antenna elements 120 in a transmit direction. In a receive direction, an RF signal received by antenna elements 120 is routed to IC chip 110 through a pair of edge contacts 112, 132. IC chip 110 then converts the receive path RF signal to an optical signal that is routed through the same or different optical conduit 165 to an external system for processing. A high bandwidth system may be realizable with this approach.

In the tapered slot design of first edge contact 132 as shown in FIG. 3, first edge contact 132 may have been constructed by first forming a notch within the top surface 135 of substrate 130 of the desired geometry for the edge contact by laser drilling, photo imaging and etching, or the like. The notch may have then been metalized through electroplating to form conductive sidewalls and a conductive base, and a front portion of the notch sliced away to form a front opening. This results in first edge contact 132 having a front surface 146 approximately coplanar with side surface 144-2, a depth d1 (see FIG. 5), and a rear surface 171. Alternatively, the notches are completely filled with metal and later laser drilled to form a conductive structure with a desired geometry. Further discussion of forming first edge contacts 132 is provided later in connection with FIG. 6. With regard to second edge contacts 112, these may be formed using various techniques. For example, edge contacts 112 may be a quilt package nodule.

Other geometries and other types of structures for first and second edge contacts 132, 112 are contemplated. For instance, the shapes for the recesses/protrusions may be rectangular, circular, oval, triangular and/or some other shape instead of the flare shape described above. Instead of a single centralized slot 149, an edge contact 132 may have an interdigitated structure with several metallic "fingers" or ridges and channels. In this case, an adjacent edge contact 112 may also have an interdigitated structure with complementary interlocking fingers or channels and ridges. In other examples, interlocking structures on one or more sidewalls 144 of cavity 140 and one or more side surfaces 117 of chip 110 may be formed mostly or entirely of dielectric or semiconductor material. In this case, edge contacts 132 and 112 may be smaller than the interlocking structures and may be located either on surfaces of the interlocking structures themselves, on other portions of the sidewalls 144/side surfaces 117, or they may form other complete interlocking structures. The smaller edge contacts, if any, may have flat edges that abut one another, or they may have small complementary geometries. In still another example, instead of forming second contacts 132 as recesses, they may be formed as protrusions while the second edge contacts 112 are formed as recesses. Alternatively, each of the edge contacts 112, 132 are protrusions, e.g., flat or slanted, that abut an adjacent edge contact 132, 112, respectively. In general, edge contacts 112, 132 may be used for conducting energy from DC to mm wave frequencies, and are particularly useful for forming low loss connections at mm wave frequencies. Since the electrical connection between adjacent edge contacts 112 and 132 is made without the use of bondwires or ribbon bonds, the inductance otherwise added by those techniques is eliminated. This results in an extremely low loss connection at frequencies up to at least 200 GHz. Further, the overall configuration including cavity 140, first edge contacts 132 and IC chip 110 with second edge contacts 112, form a compact, thin structure in which the top surfaces 115 of chips 110 may be substantially coplanar with the top surface of substrate 130. Electrical and mechanical connection of IC chips 110 to substrate 130 are simplified, as IC chips 110 may be simply snapped into cavities 140 through the interlocking of edge contacts 112, 132, completing both mechanical and electrical connections.

Substrate 130 may be a multi-layered substrate with circuitry disposed at different layers. Substrate 130 may be composed of any suitable dielectric material. In some embodiments, substrate 130 is a hard substrate such as quartz, alumina, glass or fused silica, and amenable to thin film plating to form fine features. As seen in FIG. 5, for example, substrate 130 is composed of a lower layer (interchangeably, "lower substrate") 130a and an upper layer ("upper substrate") 130b, with a ground plane 170 sandwiched therebetween. Substrate 130 may have been formed by first providing lower layer 130a, metallizing a top surface of lower layer 130a to form ground plane 170, and thereafter forming or bonding upper layer 130b on ground plane 170 using a suitable method. Some exemplary methods for such bonding include dbi bonding, frit bonding, gold bump bonding, solder bump bonding, and copper pillar bonding. Alternatively, upper layer 130b may be separately provided and may have been adhered to ground plane 170 using a suitable adhesive. Ground plane 170 may have circular apertures 182 for accommodating vias 122-1 and 122-2. Apertures 182 have large enough diameters to allow vias 122-1, 122-2 to penetrate without contacting ground plane 170, thereby enabling vias 122-1, 122-2 to function as probe feeds for antenna elements 120-1, 120-2. Ground plane 170 may serve as a microstrip ground plane to reflect RF energy transmitted/received by antenna elements 120. The microstrip ground plane can also form the ground plane of a microstrip transmission line in which conductive trace 165 is the conductor.

IC chip 110 may have a thickness approximately equal to a depth d2 from top surface 135 of substrate 130 to a top surface of ground plane 170 at the base of cavity 140. With such dimensions, the bottom surface 119 of IC chip 110 may rest on ground plane 170, and the top surface 115 of IC chip 110 may be approximately coplanar with top surface 135 of substrate 130. Alternatively, the thickness of IC chip 110 is less than depth d2 and a gap exists between ground plane 170 and bottom surface 119. Such a gap may be an air gap or a gap filled with a layer of insulating material. In some designs, it may be desirable for IC chip 110 to have one or more electrical contacts on the bottom surface 119 of IC chip 110 to make electrical connections to other components of antenna apparatus 100. In this case, corresponding apertures in ground plane 170 may be formed to facilitate the electrical connections.

Conductive vias 122-1, 122-2 are examples of conductors, and form probe feeds for antenna elements 120-1, 120-2. As described further below, a via 122 may be formed by first forming a pad on an outer surface of substrate 130, then drilling a hole through substrate 130 and filling the same with metal through electroplating or the like. A short conductive trace 168 on top surface 135 of substrate 130 may be an extension of such a via pad (or conductive trace 168 may itself be considered the via pad) and may interconnect a via 122 with a proximate first edge contact 132, e.g., by overlapping edge 171 of the first edge contact 132. Other conductive traces 165 connected to circuit components or terminals (not shown) other than an antenna element 120 may also be formed on surface 135 overlapping an edge 171 of a first edge contact 132 for electrical connection to the connected second edge contact 112. Any conductive trace 165 may make such electrical connection through another via (not shown) through substrate 130, or through a side port. Any conductive trace 165 may route an RF signal, a DC bias voltage, or a time varying control signal to/from IC chip 110 and the other circuit component.

Figure 6:
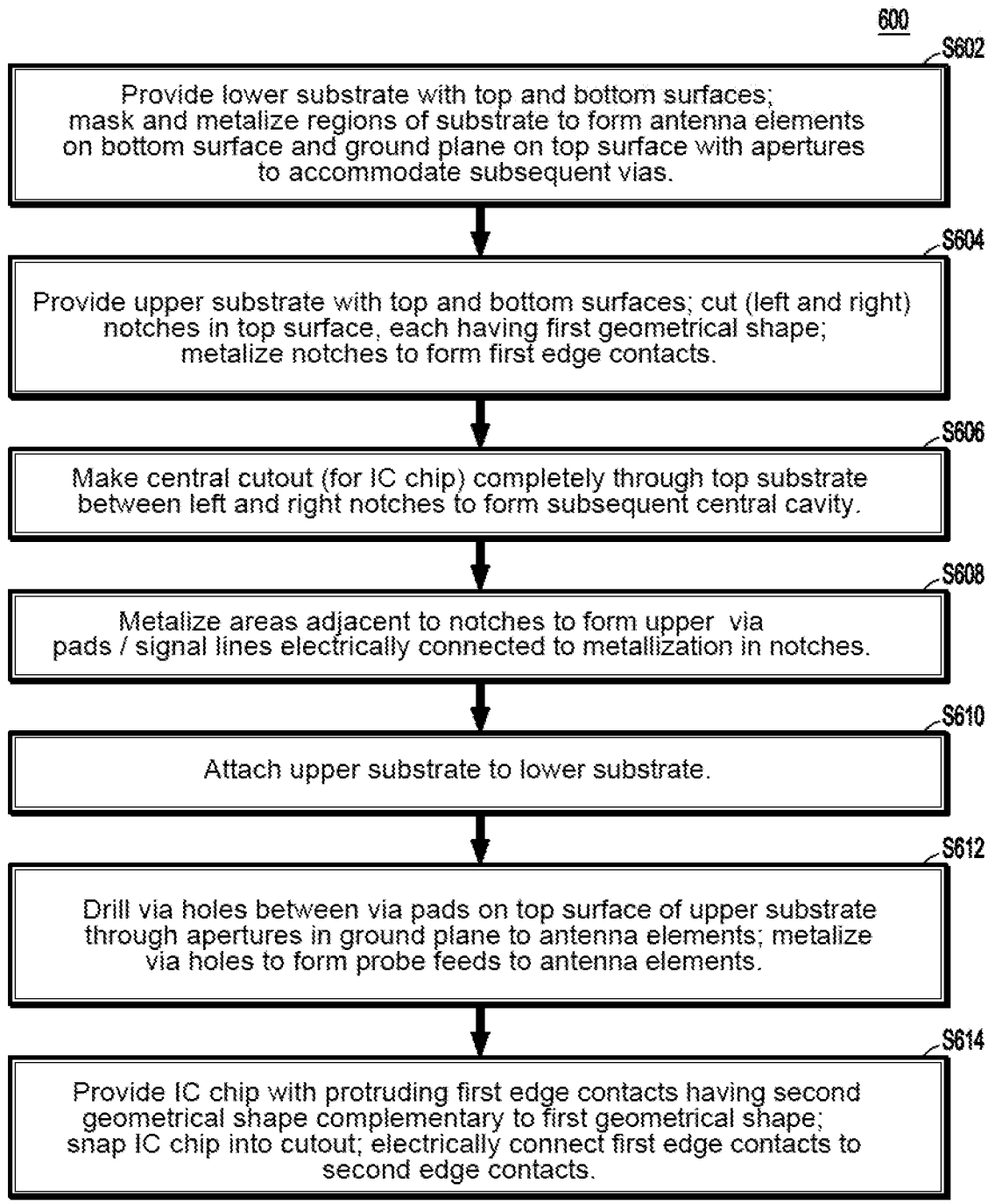
FIG. 6 is a flow diagram of an example method of forming the antenna apparatus of FIGS. 1-5.

FIG. 6 is flow diagram of an example method, 600, of forming antenna apparatus 100. FIGS. 7A-7I are each cross-sectional views or plan views illustrating structures corresponding to respective steps in method 600. Note that the order of the various process steps described below for method 600 may be changed as desired in other example embodiments.

Figure 7A:
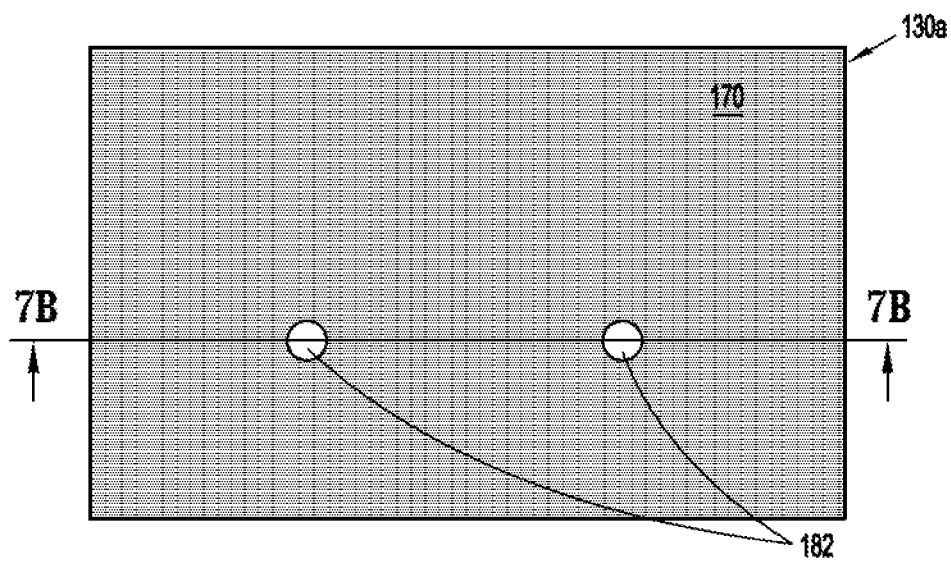
FIG. 7A is a top plan view of portion of a lower substrate, which forms part of a multi-layer substrate of an exemplary antenna apparatus, where the view illustrates an interim configuration after step S602 of the method of FIG. 6.
Figure 7B:
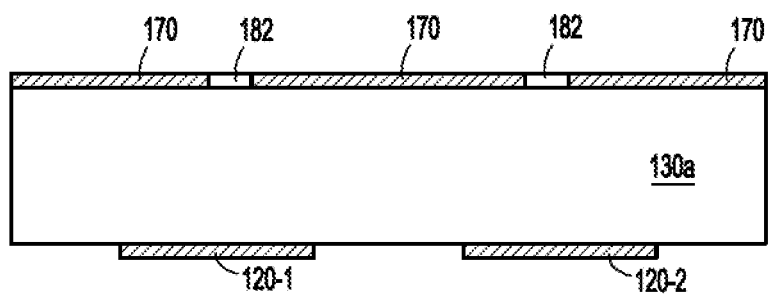
FIG. 7B is a cross-sectional view of the lower substrate of FIG. 7A taken along the lines 7B-7B.
Figure 7C:
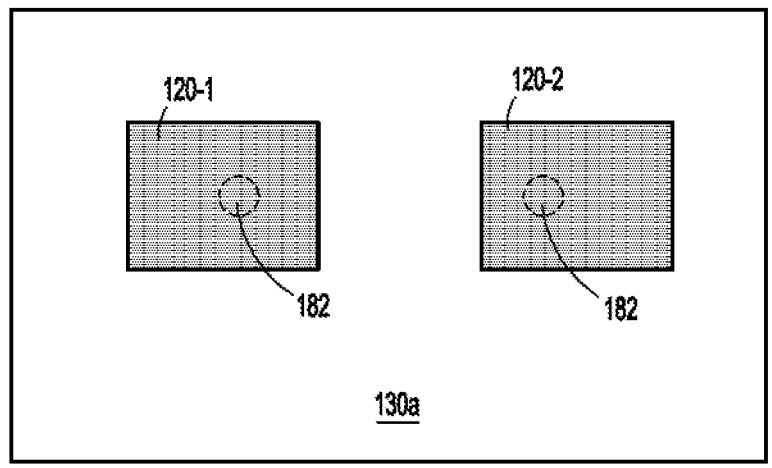
FIG. 7C is a bottom plan view of the lower substrate of FIG. 7A.

To form multi-layer substrate 130 of antenna apparatus 100, lower substrate 130a and upper substrate 130b may be separately processed and then bonded together. FIG. 7A is a top plan view of a portion of a lower substrate 130a during a process stage after pattern metallization of top and bottom surfaces thereof has been performed. FIG. 7B is a cross-sectional view of the lower substrate 130a of FIG. 7A taken along the lines 7B-7B, and FIG. 7C is a bottom view of lower substrate 130a of FIG. 7A. Referring to FIGS. 6 and 7A-7C, lower substrate 130a is provided (S602), and the top and bottom surfaces of lower substrate 130a are masked in selective regions and metallized to form antenna elements 120 on the bottom surface and a ground plane 170 on the top surface. Prior to this metallization, regions for forming apertures 182 in ground plane 170 may have been masked on the top surface and regions outside the boundaries of antenna elements 120 may have been masked on the bottom surface. Apertures 182 have a first diameter to accommodate later formed via holes with a second, smaller diameter. The larger diameter apertures 182 prevent subsequent vias 122 (shown in FIGS. 1-5) that will form probe feeds to antenna elements 120, from electrically shorting to ground plane 170.

Figure 7D:
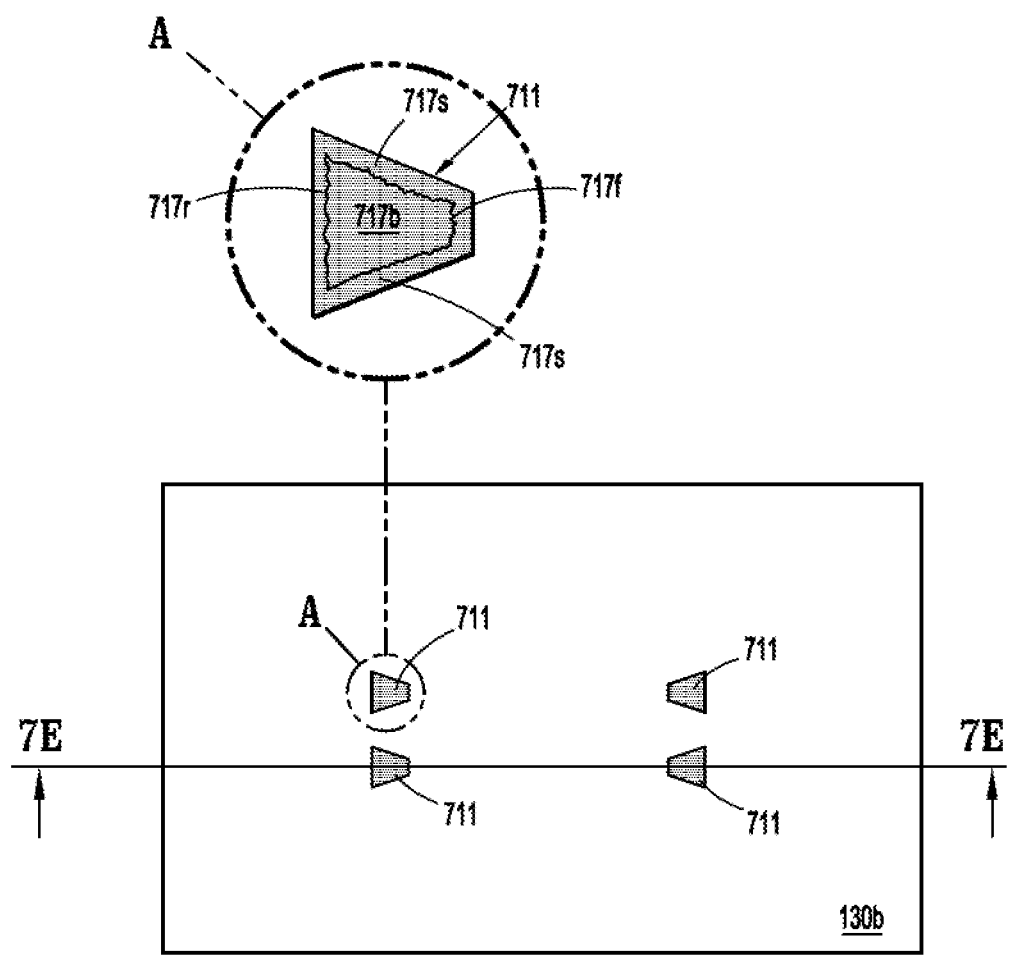
FIG. 7D is a plan view of a portion of an upper substrate of the multi-layer substrate in an interim process after step S604 of FIG. 6, and illustrates a configuration after notches for forming edge contacts have been cut out and metallized.
Figure 7E:
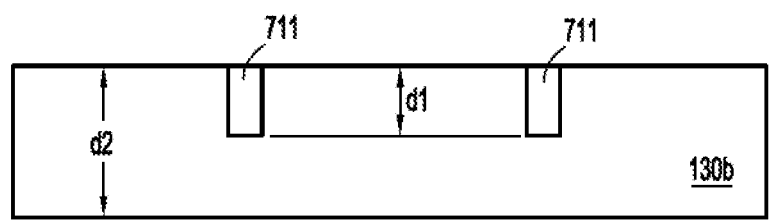
FIG. 7E is a cross-sectional view of the upper substrate of FIG. 7D taken along the lines 7E-7E.

An upper substrate with top and bottom surfaces is separately provided and processed (S604). This process may involve cutting left and right notches in the top surface, each having a first geometrical shape(s), using laser drilling, mechanical drilling, photo imaging or etching, or other suitable technique. The notches are then metallized to form the first edge contacts 132 (with some metallization sliced away afterwards during another cut-out process). For instance, FIG. 7D is a plan view of a portion of an upper substrate 130b, after notches 711 have been cut out to a depth d1 (less than the thickness d2 of upper substrate 130b) and metallized. FIG. 7E is a cross-sectional view of the upper substrate 130b of FIG. 7D taken along the lines 7E-7E. In this example notches 711 are in the form of a flare, but other structures such as multi-fingers for forming interdigitated connections are also available. As seen in the enlargement A, metallization of any notch 711 by means of electroplating or the like may produce sidewall metallization regions 717s, a front wall metallization region 717f, a rear wall metallization region 717r and a base metallization region 717b within the notch 711.

Figure 7F:
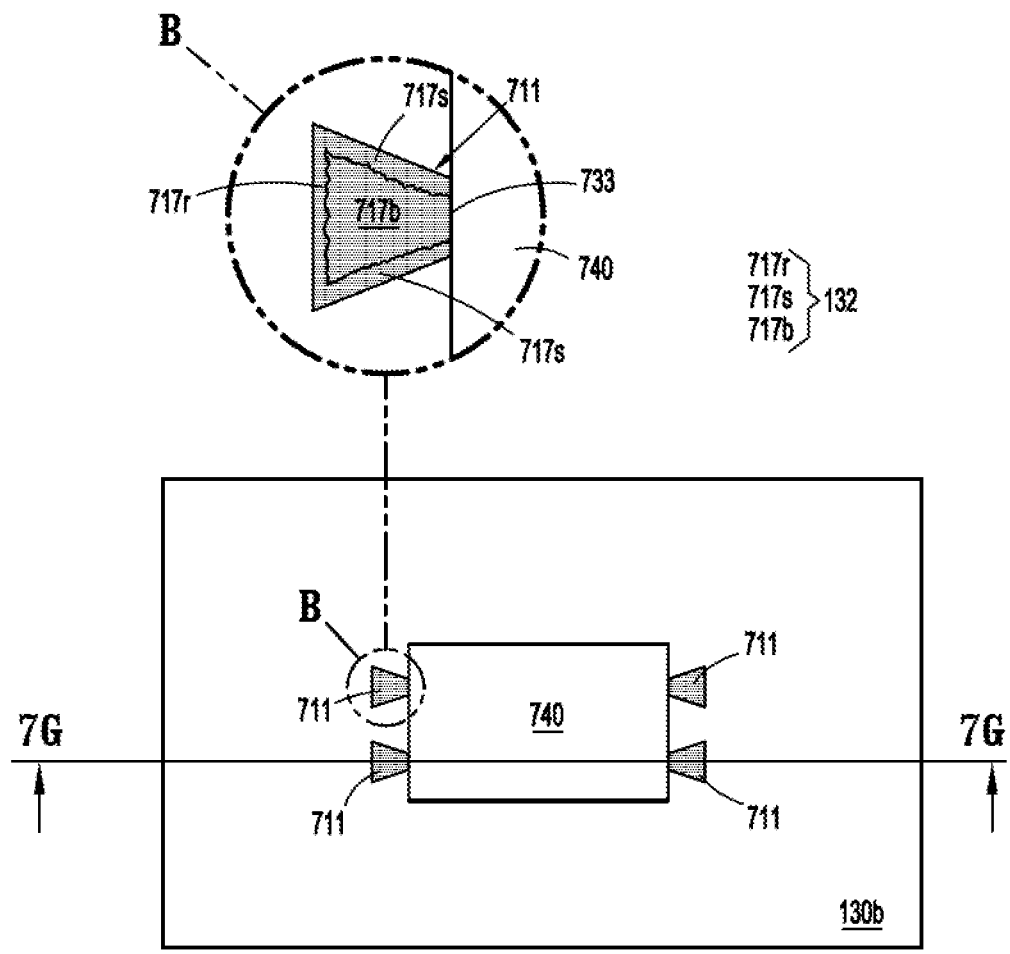
FIG. 7F is a plan view of the upper substrate of FIG. 7D after step S606 of FIG. 6.
Figure 7G:
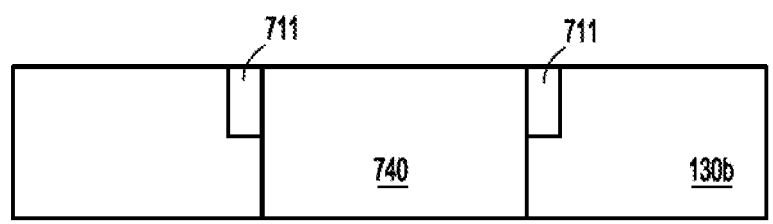
FIG. 7G is a cross-sectional view of the upper substrate of FIG. 7F taken along the lines 7G-7G.

A central cutout for the IC chip may then be made (S604) through the top substrate. For example, FIG. 7F is a plan view of substrate 130b after a rectangular cutout 740 has been made between left and right notches 711. FIG. 7G is a cross-section of the upper substrate 130b in this stage taken along the lines 7G-7G. Cutout 740 later forms cavity 140 described earlier. As depicted in the enlargement B, when cutout 740 is made, a front portion of notch 711 may be sliced off so that the front metallization 717f of the notch 711 is removed. This opens up a slot within notch 711, thereby forming a first edge contact 132, within which a second edge contact 112 of IC chip 110 is later inserted.

Areas adjacent to notches 711 may be metallized (S608) through pattern metallization to form either an adjacent upper via pad 168 or a conductive trace 165 electrically connected to the metallization in the notches. Before or after such metallization, upper substrate 130b is attached/bonded to lower substrate 130a (S610) using a suitable bonding method or non-conductive adhesive to form a multi-layered substrate 130. A via hole may then be drilled (S612) between each via pad 168 and a corresponding antenna element 120, and the via holes metallized to complete probe feeds.

Figure 7H:
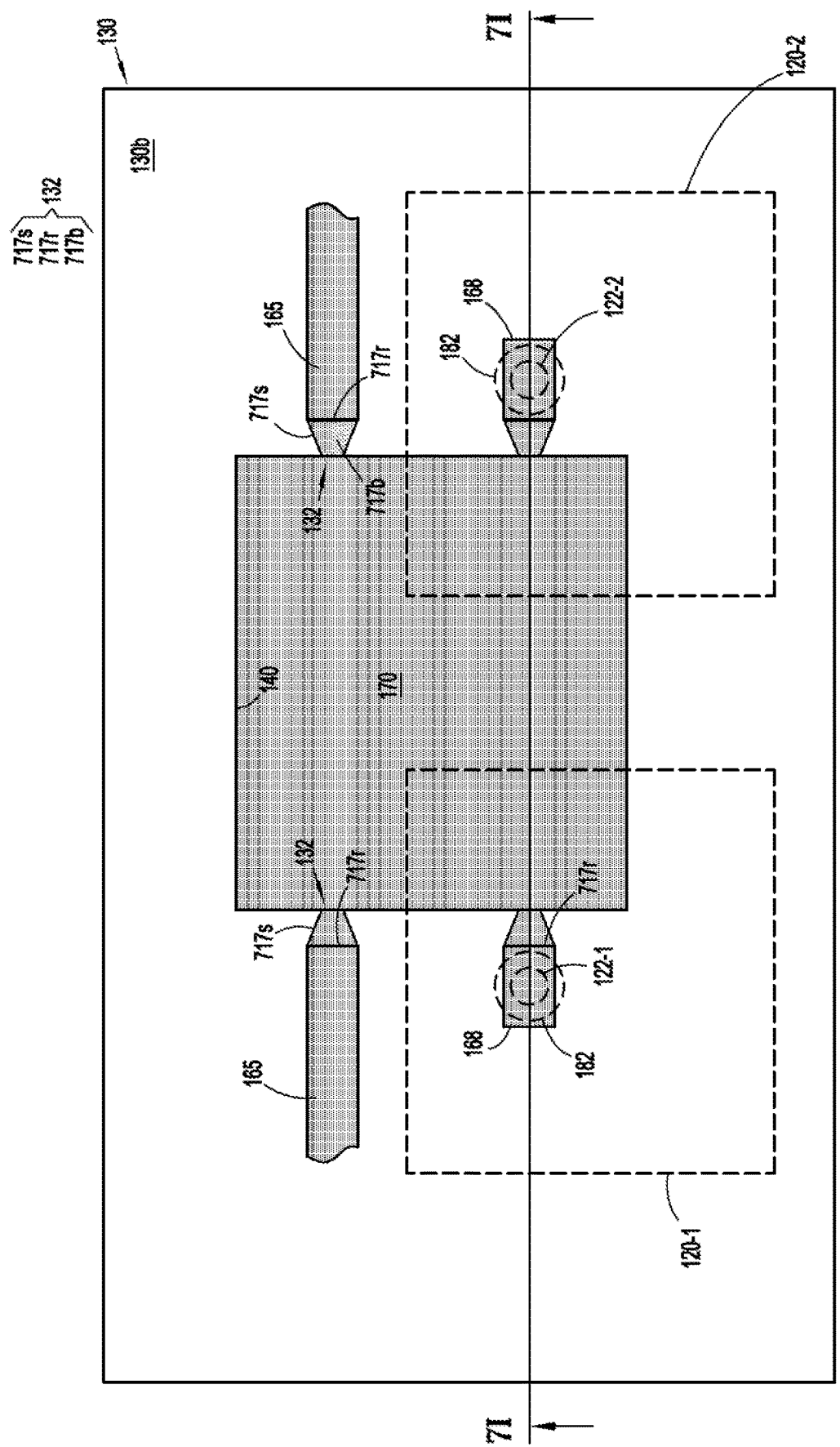
FIG. 7H is a top plan view of a portion of an exemplary multi-layered substrate which is formed after step S612 of the method of FIG. 6.
Figure 7I:
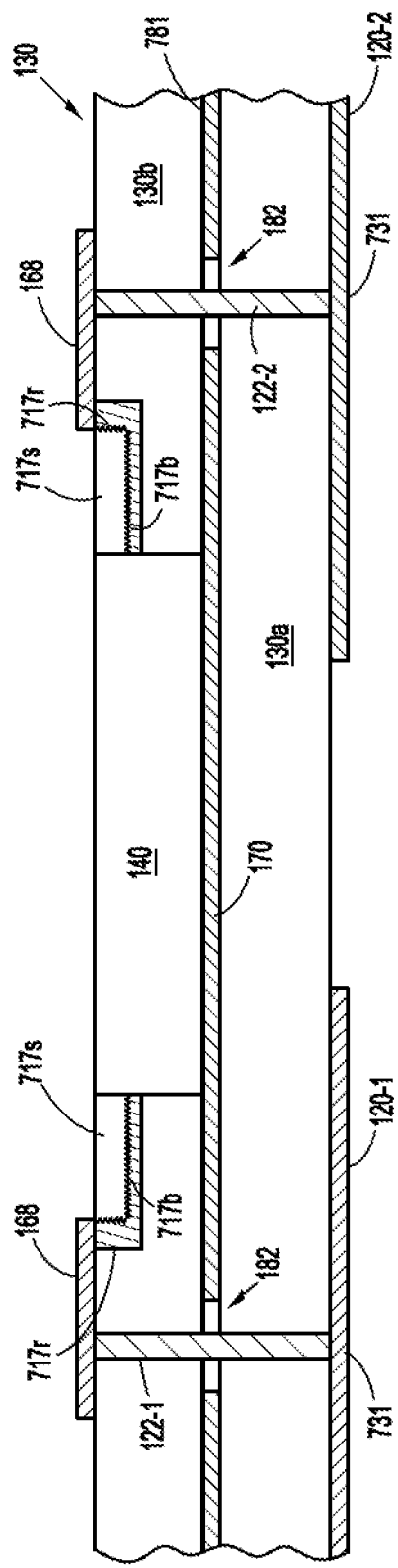
FIG. 7I is a cross-sectional view of FIG. 7H taken along the lines 7I-7I.

For example, FIG. 7H is a top plan view of a portion of the multi-layered substrate in an exemplary configuration after step S612. FIG. 7I is a cross-sectional view of FIG. 7H taken along the lines 7I-7I. In the example, a pair of conductive traces 165 and a pair of via pads 168 have each been formed on the top surface of upper substrate 130b. Via pads 168/conductive traces 165 may thereby overlap and electrically connect to the rear wall metallization surface 717r of the adjacent first edge contact 132. Alternatively, when notches 711 are initially formed, adjacent shallower channels to form via pads 168/conductive traces 165 may have been concurrently formed using the same laser drilling or etching process. Then, when notches 711 are metallized, the shallower channels are metallized during the same metallization process, thereby forming via pads 168/conductive traces 165 with a top surface coplanar with the top surface of rear metallization 717r. In still another alternative, via pads 168 and conductive traces 165 are completed prior to forming notches 711 and first edge contacts 132.

Once via pads 168 are formed, via holes may be drilled in step S612 completely through the multi-layer structure. Each via hole may be drilled in a vertical path through a via pad 168, upper substrate 130b, an aperture 182, lower substrate 130a, and through an antenna element 120. The via holes may then be electroplated to complete probe feed vias to respective antenna elements 120. In this process, metallization may be built up in via regions 731 of antenna elements 120 and then a planarization process such as chemical mechanical polishing (CMP) may planarize the lower surfaces of antenna elements 120 and via regions 731, resulting in a flat, continuous lower metal surface for antenna elements 120.

Figure 7J:
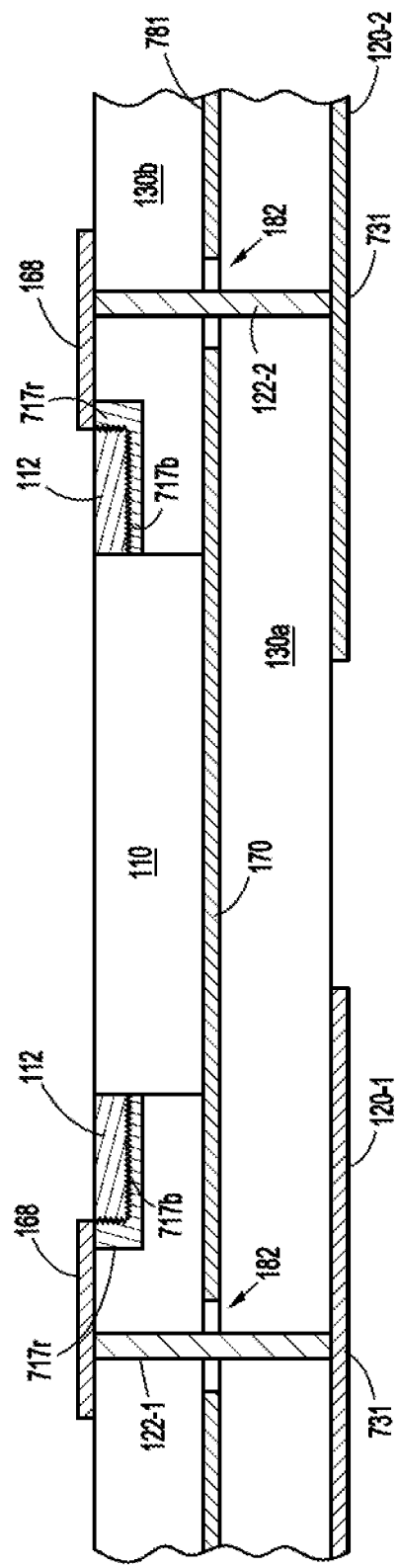
FIG. 7J is a cross-sectional view corresponding to the cross sectional view of FIG. 7I after step S614 of FIG. 6.

With the multi-layer substrate 130 thus formed, an IC chip 110 may be provided (S614) with second edge contacts 112 each having a second geometrical shape complementary to the first geometrical shape of adjacent first edge contacts 132. The IC chip is snapped into cavity 140 as illustrated in FIG. 1, resulting in a structure as shown in FIG. 7J, which illustrates second edge contacts 112 making electrical contact with metallized walls 717r, 717s and 717b of first edge contacts 132.

As discussed earlier, second edge contacts 112 may snap into first edge contacts 132 thereby forming an interlocking relationship. A press fit between the contacts 112, 132 suffices in some cases to form an electrical connection therebetween and complete formation of antenna apparatus 100. In other cases, the electrical connection between first and second edge contacts 112, 132 is enhanced using solder or other conductive bonding material 190 as depicted in FIG. 2 described earlier.

Method 600 may be expanded to a method of fabricating an electronically steerable antenna array using the same operations described above but on an expanded scale by: (i) forming a plurality of cavities 140 each with at least one second edge contact 132 within substrate 130, where the plurality of cavities 140 are spatially arranged along the top surface of substrate 130; (ii) forming a plurality of antenna elements 120 or a plurality of sets of antenna elements 120 spatially arranged along the bottom surface of cavity 130 (i.e., along the bottom surface of lower substrate 130a); and (iii) snapping each of a plurality of IC chips 110 into a respective cavity 140, resulting in beamforming components within each IC chip 110 being electrically connected to at least one antenna element 120 through at least one respective conductive via 122. In other words, the expanded method includes, for each of the cavities 140: forming a second edge contact 132 at a sidewall of the cavity 140; placing a respective one of the IC chips 110 into the cavity 140; electrically connecting the respective first and second edge contacts 132, 112 (which may occur when the IC chip 110 is snapped into the cavity 140); and electrically connecting the beamforming components of the IC chip 110 placed therein to a respective at least one of the antenna elements 120 (which also may occur when the IC chip 110 is snapped into the cavity 140).

Figure 8A:
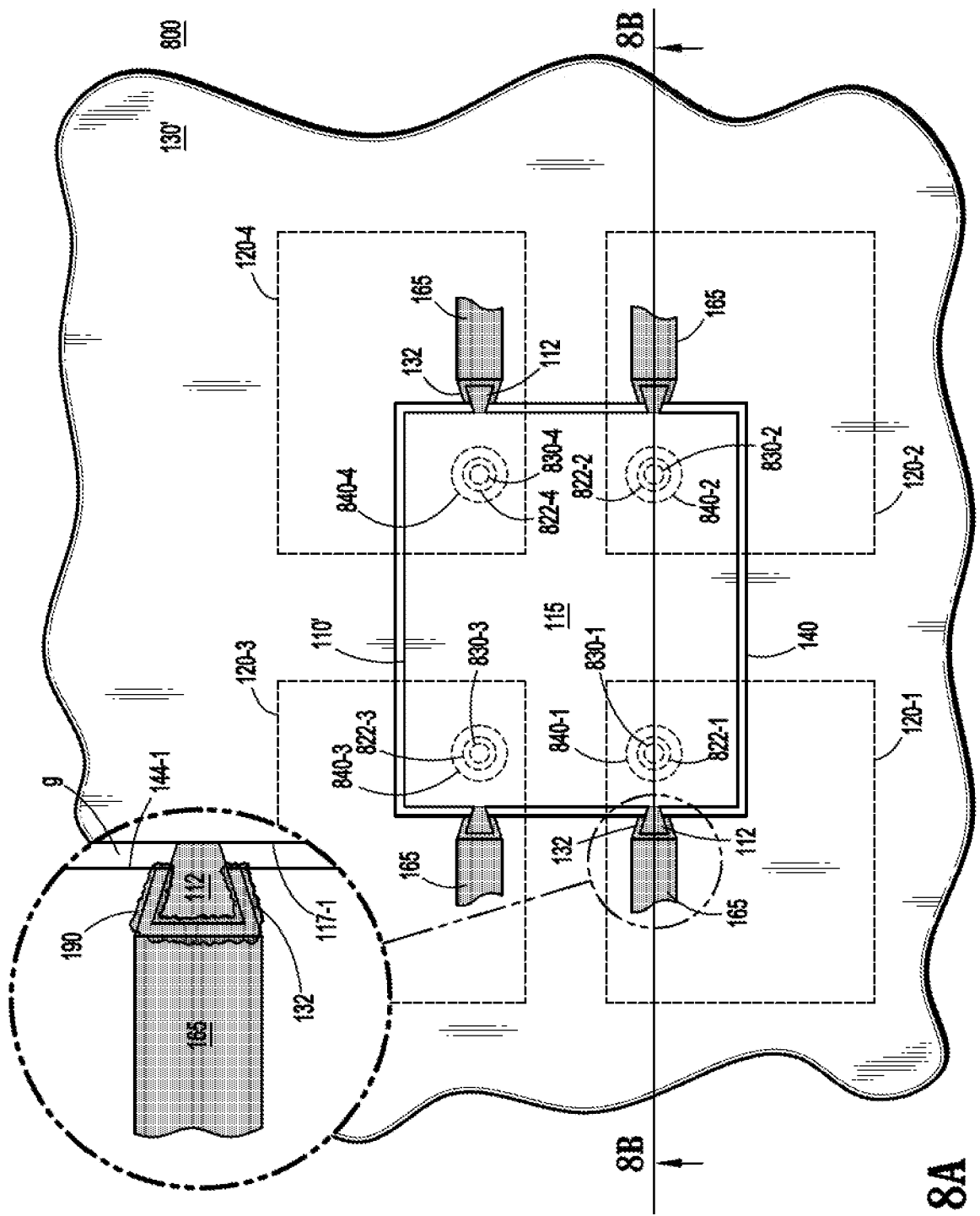
FIG. 8A is a plan view of an electronic device in accordance with another embodiment.
Figure 8B:
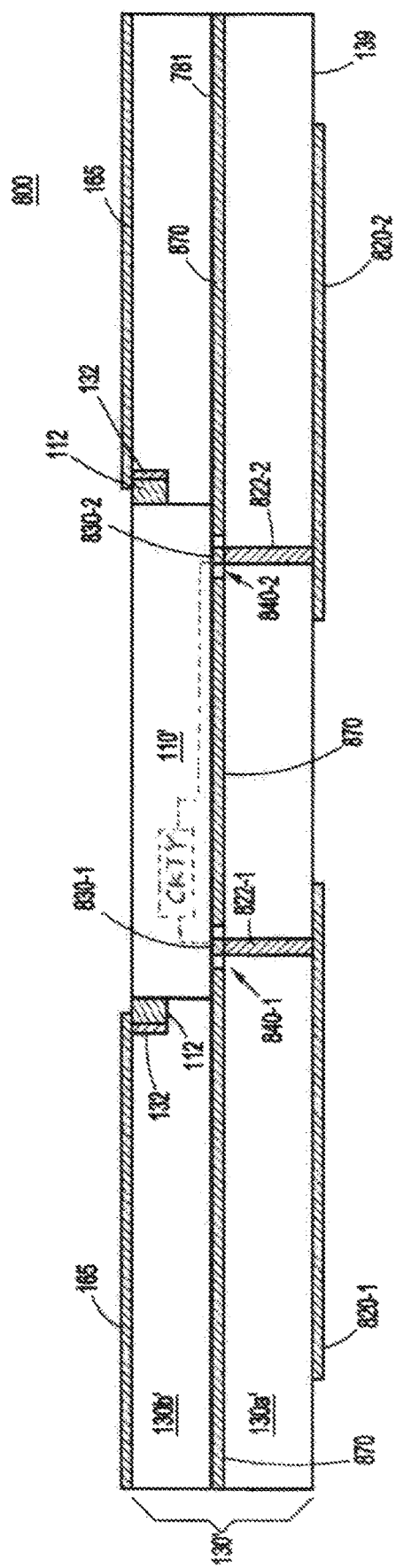
FIG. 8B is a cross-sectional view taken along the lines 8B-8B' of FIG. 8A.

FIG. 8A is a plan view of an electronic device, 800, in accordance with another embodiment. FIG. 8B is a cross-sectional view taken along the lines 8B-8B of FIG. 8A. In one implementation, electronic device 800 is an antenna apparatus having at least one antenna element, e.g., antenna elements 820-1, 820-2, 820-3, 820-4 electrically connected to an IC chip 110'. This example will be primarily described hereafter. In other embodiments, discussed below, electronic device 800 is a non-antenna implementation that omits antenna elements 820-1 to 820-4. Hereafter, when discussing an antenna implementation, electronic device 800 will be referred to as antenna apparatus 800.

Antenna apparatus 800 differs from the above-described antenna apparatus 100 primarily by using a probe feed connection to at least one component, e.g., an antenna element, through a connection at a bottom surface of IC chip 110', rather than through edge contacts 112, 132. Substrate 130' is a multi-layered substrate comprised of lower substrate 130a' bonded to upper substrate 130b' and may be substantially the same as substrate 130 except for the locations of apertures 840-1, 840-2, 840-3, 840-4 within an embedded ground plane 870. For instance, first to fourth antenna elements 820-1 to 820-4 may be disposed on bottom surface 139 of substrate 130'. IC chip 110' may include at least one bottom contact, e.g., first to fourth bottom contacts 830-1, 830-2, 830-3, 830-4 centrally located within respective apertures 840-1 to 840-4 within ground plane 870. Bottom contacts 830-1 to 830-4 may each include a connection element such as a solder bump or copper pillar on an outer surface thereof for electrical connection to vias 822-1, 822-2, 822-3 and 822-4, respectively. Alternatively, the connection element (e.g., solder bump/copper pillar) is originally formed at the ends of vias 822 (in this case, each illustrated contact 830 is understood to include a bottom contact of IC chip 110' and the connection element). Vias 822-1 to 822-4 are probe feeds each electrically connected between a respective feed point of antenna element 820-1 to 820-4 and an electrical contact 830-1 to 830-4. Electrical contacts 830 may each connect to RF transmitter and/or receiver circuitry ("CKTY") disposed within IC chip 110' for handling signal transmission/reception with respect to an antenna element 820.

Antenna apparatus 800 includes at least one first edge contact 132 formed at a sidewall 144 of cavity 140 for connection to a corresponding at least one second edge contact 112 of IC chip 110'. Each conductive trace 165 connects to an adjacent first edge contact 132 in the same manner described above, for completing an electrical connection between another component/terminal of antenna apparatus 800 and RF circuitry within IC chip 110'. In the illustrated example, four conductive traces 165 are provided for connection to respective second edge contacts 112. Any conductive trace 165 may connect to the component/terminal through a side contact on substrate 130' or through a via (neither shown).

In an alternative embodiment to that shown in FIGS. 8A and 8B, at most three bottom contacts 830 are connected to at most three antenna elements 820 through vias 822, but at least one other antenna element 820 is electrically connected to IC chip 110' through one set of edge contacts 132, 112 and a via extending from the top surface of substrate 130'. In either of these cases, at least one other bottom contact 830 may connect to a conductive trace 165 (not shown) embedded within lower substrate 130a' for connection to another component to exchange RF signals, control signals or DC bias, or to ground plane 870 to make a ground connection.

In one non-antenna implementation, at least one bottom contact 830 is connected to an inter-layer via (e.g., a shortened version of via 822-1) that connects to a conductive trace 165 (both not shown) extending within lower substrate layer 130a'. In still another non-antenna implementation, ground plane 870 or portion thereof is replaced by a metal layer configured as a thermal heat sink to cool IC chip 110', while at least one bottom contact 830 is connected to an inter-layer via similarly connected to a conductive trace 165.

Figure 9:
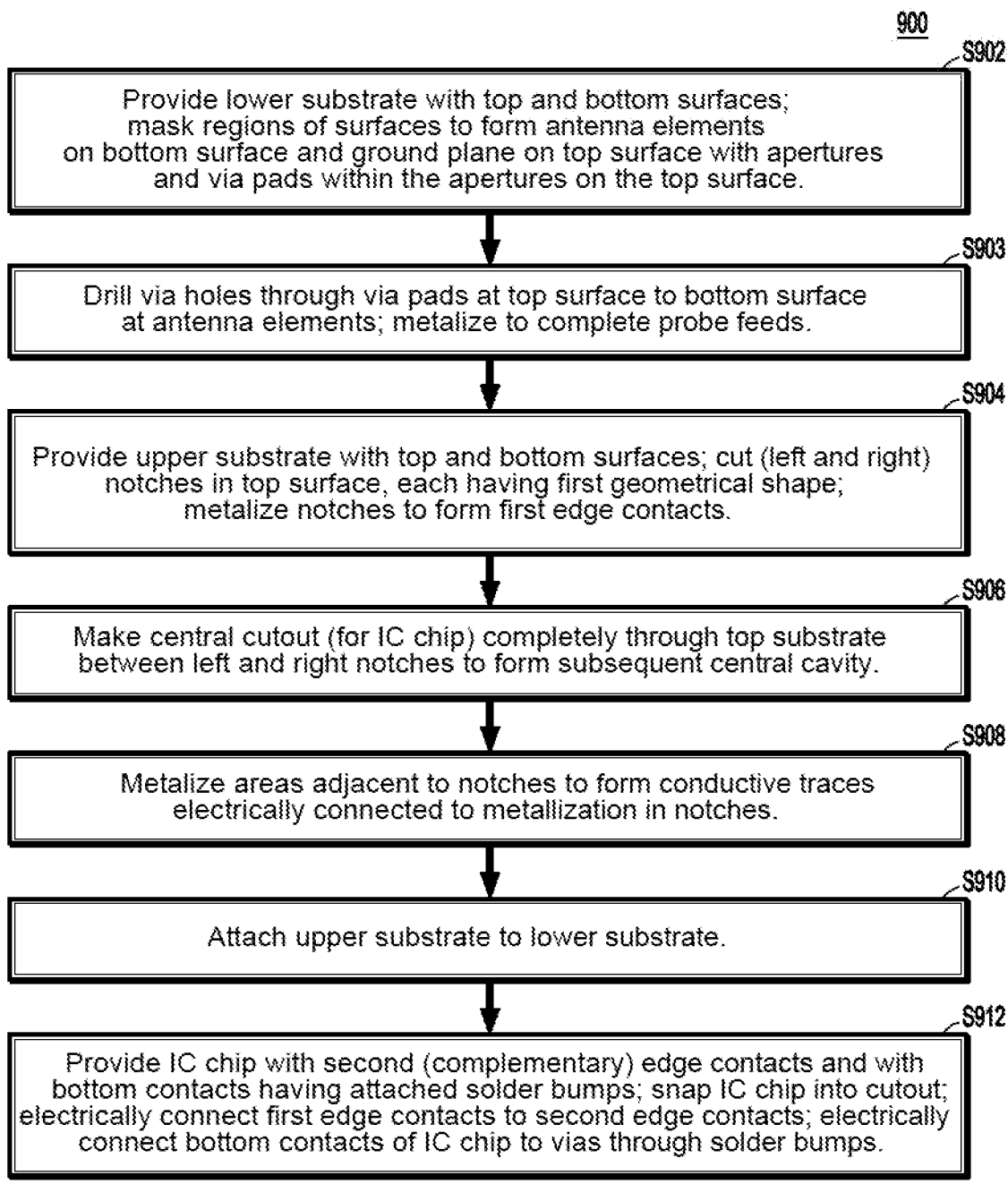
FIG. 9 is a flow diagram illustrating an example method of fabricating the electronic device of FIGS. 8A-8B.

FIG. 9 is a flow diagram illustrating an example method 900 of fabricating electronic device 800. With method 900, lower substrate 130a' and upper substrate 130b' may be separately processed and then bonded together. IC chip 110' is then snapped into the central cavity 140 and electrical connections between respective contacts of IC chip 110' to those formed within substrate 130' are made.

In detail, lower substrate 130a' having top and bottom surfaces is provided (S902). Regions of the top and bottom surfaces are masked for pattern metallization to form antenna elements 120 on the bottom surface and ground plane 870 on the top surface with apertures 840 and via pads (upper part of vias 830) within the apertures. Via holes are then drilled (S903) through the via pads to the bottom surface at feed points to the antenna elements. The via holes are metalized to complete probe feeds. Upper substrate 130b' may then be processed in steps S904, S906, S908 and S908 in the same manner as steps S604, S606, S608 and S608, respectively, except that each edge contact 132 may connect to a conductive trace 165 instead of a via 168. To form an alternative configuration in which some edge contacts 132 connect to an adjacent via 168, process steps S904-S908 may be the same as S604-S608.

Upper substrate 130b' is then attached/bonded to lower substrate 130a' (S910) using a bonding method or a non-conductive adhesive 789. As mentioned, suitable bonding methods for this purpose include dbi bonding, frit bonding, gold bump bonding, solder bump bonding, and copper pillar bonding.

IC chip 110' may be provided (S912) with complementary (second) edge contacts 112, and with bottom contacts 830-1 to 830-4 having attached solder bumps or copper pillars. IC chip 110' is snapped into cavity 140 and electrical connection is made between corresponding first and second edge contacts 132, 112 in the manner described earlier. Electrical connection between bottom electrical contacts 830 and respective vias 822 may be made by heating and cooling the solder bumps/copper pillars attached to electrical contacts 830. Note that the solder bumps/copper pillars may be alternatively attached to the ends of vias 822 after their formation, instead of to electrical contacts 830, and thereafter the electrical connection of vias 822 to electrical contacts 830 may be made using the same heating and cooling technique.

Figure 10A:
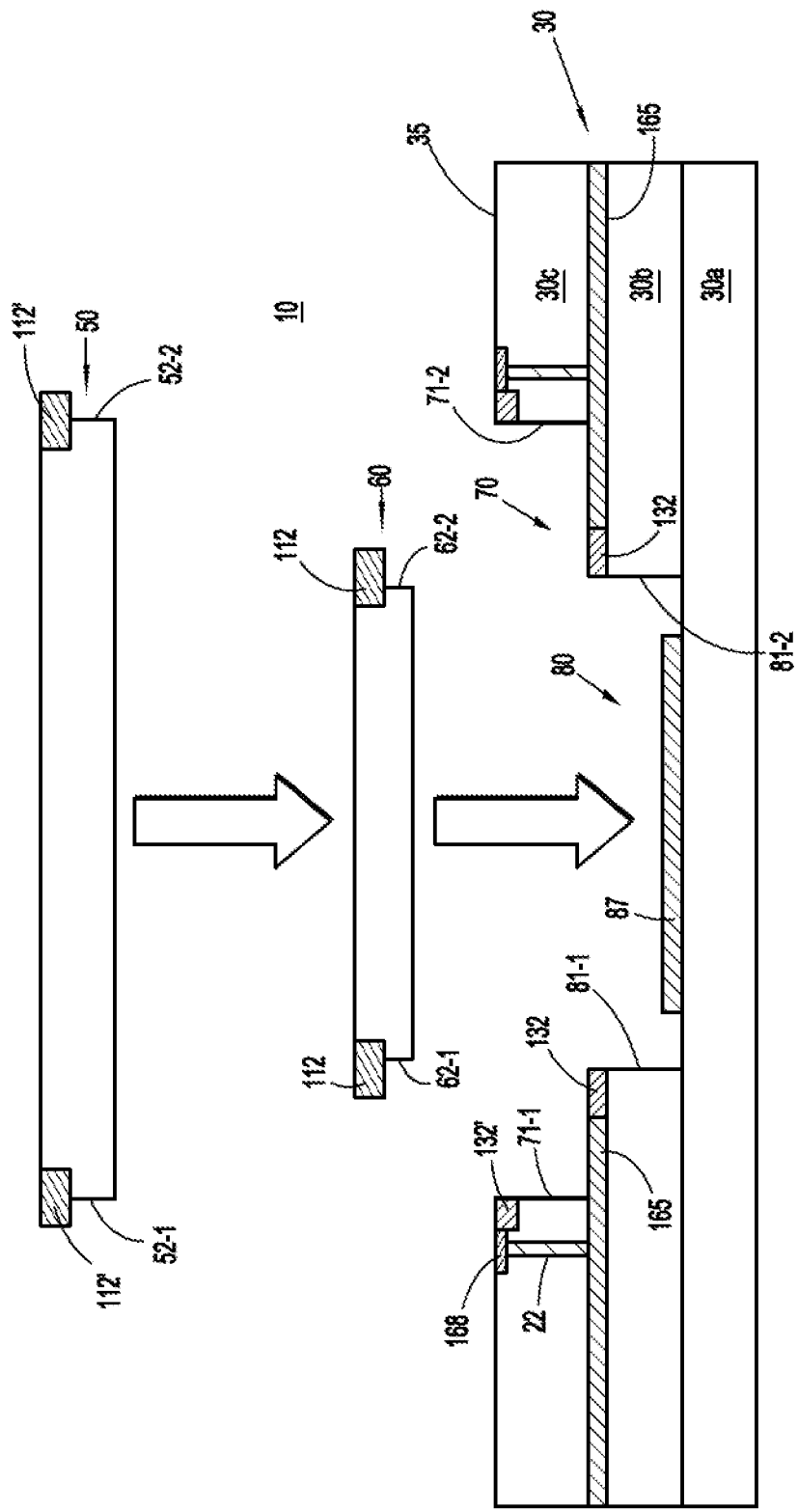
FIG. 10A is an exploded cross-sectional view of an electronic device with embedded chips according to an embodiment.
Figure 10B:
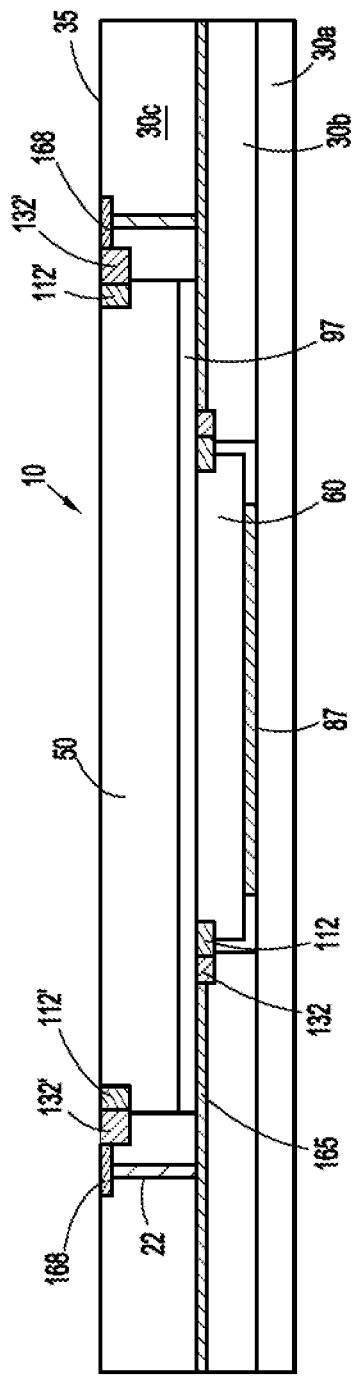
FIG. 10B is a cross-sectional view of the electronic device of FIG. 10A in an assembled state.

FIG. 10A is an exploded cross-sectional view of an electronic device, 10, with embedded IC chips according to another embodiment. FIG. 10B is a cross-sectional view of electronic device 10 in an assembled state. Referring to FIGS. 10A and 10B, electronic device 10 includes a multilayer substrate 30 with a dual cavity structure formed within a top surface 35; a first IC chip 60; and a second IC chip 50. First and second IC chips 60, 50 are disposed within respective first and second cavity portions 80, 70 of the dual cavity structure. First cavity portion 80 is directly below second cavity portion 70 and has a perimeter smaller than that of second cavity portion 70.

First cavity portion 80 has at least one sidewall 81 at which one or more first edge contacts 132 is disposed, where each first edge contact 132 may be electrically connected to an adjacent second edge contact 112 disposed at a side surface 62 of IC chip 60. Likewise, second cavity portion 60 has at least one first edge contact 132' electrically connected to at least one second edge contact 112' on a side surface 52 of IC chip 50. In the illustrated example, cavity portion 80 includes at least one first edge contact 132 at each of opposite sidewalls 81-1, 81-2; and second cavity portion 70 includes at least one first edge contact 132' at each of opposite sidewalls 71-1, 71-2 for connection to corresponding second edge contacts. Edge contacts 132, 132', 112, 112' may have the same or similar structures to those described earlier, and may be fabricated and electrically connected to one another in the same or similar manner to that already described.

Any edge contact 132 or 132' may electrically connect to another component of electronic device 10 through a via and/or a conductive trace within substrate 30. For example, IC chips 50 and 60 may be electrically connected to one another through one or more sets of edge contacts 112, 132, 132' and 112'. For instance, as depicted in FIGS. 10A and 10B, substrate 30 may be composed of a lower layer 30a, a central layer 30b and an upper layer 30c. Conductive traces 165 may be disposed between layers 30a and 30b and between layers 30b and 30c. In the shown example, circuitry within first IC chip 60 may electrically connect to circuitry within second IC chip 50 through a path comprising a second edge contact 112, a first edge contact 132, a first conductive trace 165, a blind via 22 extending through substrate layer 30c, a via pad/second conductive trace 168, a first edge contact 132' and a second edge contact 112'.

In one example implementation, first IC chip 60 includes an amplifier electrically coupled to one or more antenna elements (not shown) disposed at a lower surface of substrate layer 30a. In this case, the amplifier of first IC chip 60 may be electrically connected to beamforming network circuitry included within second IC chip 50 through the above-noted connection path. Further, several, tens or a multiplicity of IC chips 50 and 60 may be spatially arranged in cavities across substrate 30 to drive an antenna array such as a phased array.

First IC chip 60 may be composed of a different semiconductor material than that of second IC chip 50. In one example, first IC chip 60 is composed of InP and second IC chip 50 is composed of SiGe.

First IC chip 60, when assembled within first cavity portion 80, may have a top surface that is approximately coplanar with a top surface of first cavity portion 80. Second IC chip 50 may have a thickness dimension that is less than the depth of second cavity portion 70, such that when second IC chip 50 is assembled within second cavity portion 70, its top surface may be approximately coplanar with top surface 35 of substrate 30, but its bottom surface may be spaced from a top surface of second cavity portion 70 by a gap 97. In one example, gap 97 is an air gap. In other examples, gap 97 is an insulating underfill material formed over first IC chip 60 after first IC chip 60 is assembled within first cavity portion 80. in the latter case, second IC chip 50 may be placed over the underfill material for assembly within second cavity portion 50. For instance, the underfill material may have apertures allowing for electrical connection between upper contacts formed on first IC chip 60 and lower contacts formed on second IC chip 50.

A layer 87 of material may be disposed at a bottom surface of first cavity portion 80. In an example, layer 87 is a portion of a ground plane akin to ground planes 170 or 870 in the above-discussed embodiments. In this case, other ground plane portions (not shown) are disposed surrounding layer 87 between layers 30a and 30b, and all the ground plane portions together act as a ground plane for antenna elements disposed on the lower surface of substrate layer 30a. In a non-antenna implementation, the collective ground plane may just form a ground surface for circuit paths between circuit components. Layer 87 may alternatively be configured to serve as a thermal heat sink.

In other examples, layer 87 is not a ground plane but is patterned to form one or more conductive traces for RF, DC or control signal connections between circuitry within first IC 60 and other circuit elements within electronic device 10.

Electronic devices and antenna apparatus in accordance with the presently disclosed technology, such as those described above, may exhibit certain advantages over conventional devices. For instance, due to the compact configurations as described, embodiments may allow for high performance signal routing at extremely high frequencies, e.g., on the order of 200 GHz. Such high performance at least partially stems from the elimination or minimization of inductance from bondwires between the chip and conductive traces/vias on the substrate that would otherwise be employed. Embodiments may empower a next generation of such extremely high frequency phased arrays and other components. Compact, thin configurations are realizable with outer surfaces of the IC chips substantially coplanar with the outer substrate surface. Fabrication is simplified by means of the IC chips being simply snapped into the cavities of the multi-layer substrate and concurrently completing both mechanical and electrical connections through the interlocking of the first and second edge contacts.

While the technology described herein has been particularly shown and described with reference to example embodiments thereof, it will be understood by those of ordinary skill in the art that various changes in form and details may be made therein without departing from the spirit and scope of the claimed subject matter as defined by the following claims and their equivalents.

What is claimed is:

1. An electronic device comprising:
a substrate having a cavity in an outer surface thereof, the substrate having a sidewall defining a portion of the cavity, wherein a first edge contact is formed at the sidewall;
an integrated circuit (IC) chip disposed within the cavity, having a bottom surface facing a bottom surface of the cavity, a side surface facing the sidewall, and a second edge contact formed on the side surface electrically connected to the first edge contact, and circuitry within the IC chip connected to a connection element at the bottom surface of the IC chip;
a circuit element supported by the substrate and coupled to the circuitry through the connection element and
a ground plane having at least a portion thereof located at the bottom surface of the cavity and extending continuously from a first side of the IC chip to an opposite, second side of the IC chip, the ground plane including an opening within which the connection element is disposed.

2. The electronic device of claim 1, wherein the circuit element is a conductive trace within the substrate.

3. The electronic device of claim 1, wherein the connection element comprises a solder bump.

4. The electronic device of claim 1, wherein the connection element comprises a conductive pillar.

5. The electronic device of claim 1, wherein a further portion of the ground plane extends within the substrate outside a perimeter of the cavity.

6. The electronic device of claim 1, wherein the circuitry within the IC chip is radio frequency (RF) circuitry comprising beamforming components for steering a beam formed by an antenna array.

7. The electronic device of claim 1, further comprising a heat sink at the bottom surface of the IC chip.

8. The electronic device of claim 1, wherein the first and second edge contacts are soldered together.

9. An electronic device comprising:
a substrate having a cavity in an outer surface thereof, the substrate having a sidewall defining a portion of the cavity, wherein a first edge contact is formed at the sidewall;
an integrated circuit (IC) chip disposed within the cavity, having a bottom surface facing a bottom surface of the cavity, a side surface facing the sidewall, and a second edge contact formed on the side surface electrically connected to the first edge contact, and circuitry within the IC chip connected to a connection element at the bottom surface of the IC chip; and
a circuit element coupled to the circuitry through the connection element, wherein the circuit element is attached to a bottom surface of the substrate and connected to the connection element through a conductive via extending from the connection element to the bottom surface of the substrate.

10. An electronic device comprising:
a substrate having a cavity in an outer surface thereof, the substrate having a sidewall defining a portion of the cavity, wherein a first edge contact is formed at the sidewall;
an integrated circuit (IC) chip disposed within the cavity, having a bottom surface facing a bottom surface of the cavity, a side surface facing the sidewall, and a second edge contact formed on the side surface electrically connected to the first edge contact, and circuitry within the IC chip connected to a connection element at the bottom surface of the IC chip; and
a circuit element supported by the substrate and coupled to the circuitry through the connection element,
wherein the sidewall and the side surface have respective first and second interlocking features with complementary shapes, the first and second interlocking features being interlocked with one another.

11. The electronic device of claim 10, wherein the first interlocking feature is a recess in the sidewall or a protrusion from the sidewall, and the second interlocking feature is a complementary protrusion from the side surface or a complementary recess in the side surface, respectively.

12. The electronic device of claim 10, wherein the first and second edge contacts are disposed on respective surfaces of the first and second interlocking features.

13. The electronic device of claim 10, wherein:
the sidewall is a first sidewall, and the cavity having a second sidewall opposite the first sidewall, wherein a third edge contact is formed on the second sidewall; and
the side surface is a first side surface, the IC chip having a second side surface opposite the first side surface and a fourth edge contact on the second side surface connected to the third edge contact.

14. An electronic device comprising:
a substrate having a cavity in an outer surface thereof, the cavity having a dual cavity structure with a first cavity portion directly below a second cavity portion, the first cavity portion having a first perimeter smaller than a second perimeter of the second cavity portion;
a first integrated circuit (IC) chip disposed within the first cavity portion, the first cavity portion having a first sidewall at which a first edge contact is formed, the first IC chip having a second edge contact connected to the first edge contact; and a second IC chip disposed within the second cavity portion, the second cavity portion having a second sidewall at which a third edge contact is formed, the second IC chip having a fourth edge contact electrically connected to the third edge contact.

15. The electronic device of claim 14, wherein the first IC chip and the second IC chip are electrically coupled to one another.

16. The electronic device of claim 15, wherein the first IC chip and the second IC chip are electrically coupled to one another through a via within the substrate, the via coupling the first edge contact to the third edge contact.

17. The electronic device of claim 16, further comprising a conductive trace within the substrate, electrically coupling one end of the via to the third edge contact.

18. The electronic device of claim 14, wherein the first IC chip includes an upper surface contact, and the second IC chip includes a lower surface contact connected to the upper surface contact of the first IC chip.

19. The electronic device of claim 14, wherein an upper surface of the first IC chip is separated from a bottom surface of the second IC chip by an air gap or an underfill material.

20. The electronic device of claim 14, further comprising a conductive layer facing a bottom surface of the first IC chip, the conductive layer being one of a ground surface or a layer forming a plurality of conductive traces for RF, DC or control signal connections between the first IC chip and other circuit elements within the electronic device.

* * * * *